United States Patent
Nishikawa et al.

(10) Patent No.: US 7,830,367 B2
(45) Date of Patent: Nov. 9, 2010

(54) TOUCH PANEL AND PROTECTIVE PANEL FOR DISPLAY WINDOW OF ELECTRONIC DEVICE USING THE SAME

(75) Inventors: Kazuhiro Nishikawa, Kyoto (JP); Yoshihiro Kai, Kyoto (JP); Kazuto Nakamura, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 924 days.

(21) Appl. No.: 11/597,202

(22) PCT Filed: May 20, 2005

(86) PCT No.: PCT/JP2005/009703

§ 371 (c)(1), (2), (4) Date: Feb. 20, 2007

(87) PCT Pub. No.: WO2005/114367

PCT Pub. Date: Dec. 1, 2005

(65) Prior Publication Data

US 2007/0218957 A1    Sep. 20, 2007

(30) Foreign Application Priority Data

May 21, 2004 (JP) .............................. 2004-151172

(51) Int. Cl.
*G06F 3/045* (2006.01)
(52) U.S. Cl. ..................................................... 345/174
(58) Field of Classification Search .................. 345/173, 345/174; 439/84; 178/18.05
See application file for complete search history.

(56) References Cited

U.S. PATENT DOCUMENTS 4,653,186 A    3/1987 Kamijo et al.

(Continued)

FOREIGN PATENT DOCUMENTS

CN    2460771    11/2001

(Continued)

OTHER PUBLICATIONS

International Preliminary Report on Patentability (in English) issued Mar. 1, 2007 in the International Application of which the present application is the U.S. National Stage.

(Continued)

*Primary Examiner*—Chanh Nguyen
*Assistant Examiner*—Allison Walthall
(74) *Attorney, Agent, or Firm*—Wenderoth, Lind & Ponack, L.L.P.

(57) ABSTRACT

A touch panel is capable of obtaining a stable connection resistance without requiring fitting accuracy at the time of the connection to an external terminal, and a protective panel for a display window of an electronic device using the same. The analog type touch panel includes a touch side substrate and a non-touch side substrate each having resistive films provided on opposed inner surfaces thereof.

Through-holes are formed at the periphery of the non-touch side substrate. A connecting part for electrically connecting electrodes of the resistive films to an external terminal includes a conductive paste is injected into the through-holes and a rivet is inserted into each of the through-holes from the lower surface side so that a head of the rivet 14 forms flat connecting electrodes for connection to the external terminal on the lower surface of the non-touch side substrate.

8 Claims, 9 Drawing Sheets

U.S. PATENT DOCUMENTS

| | | | | |
|---|---|---|---|---|
| 4,696,851 | A | * | 9/1987 | Pryor .................. 428/210 |
| 5,210,940 | A | * | 5/1993 | Kawakami et al. ........... 29/852 |
| 5,275,330 | A | | 1/1994 | Isaacs et al. |
| 6,081,996 | A | * | 7/2000 | Kruppa et al. ............... 29/840 |
| 6,825,895 | B2 | * | 11/2004 | Nakano et al. ............... 349/63 |
| 6,890,449 | B2 | | 5/2005 | Kawamoto et al. |
| 2002/0179331 | A1 | | 12/2002 | Brodsky et al. |
| 2003/0011315 | A1 | * | 1/2003 | Ito et al. .................. 315/169.3 |

FOREIGN PATENT DOCUMENTS

| | | | |
|---|---|---|---|
| CN | 1383707 A | | 12/2002 |
| JP | 2-148878 | | 6/1990 |
| JP | 2148878 | * | 6/1990 |
| JP | 7-336115 | | 12/1995 |
| JP | 9-50731 | | 2/1997 |
| JP | 09050731 | * | 2/1997 |
| JP | 11073148 | * | 3/1999 |
| JP | 2001-85835 | | 3/2001 |
| JP | 2002-252440 | | 9/2002 |
| JP | 2003-75859 | | 3/2003 |
| JP | 2003-283084 | | 10/2003 |
| WO | 00/79475 | | 12/2000 |

OTHER PUBLICATIONS

First Notification of Opinion on Examination (with English Translation) issued Nov. 2, 2007 in counterpart Chinese Application No. 200580016459.X.

$2^{nd}$ Notification of Opinion on Examination issued Apr. 11, 2008 in a Chinese application that is a foreign counterpart to the present application (and a partial English translation).

European Patent Office Action issued Jul. 10, 2009 in a European application that is a foreign counterpart to the present application.

Supplementary European Search Report issued Sep. 26, 2008 in EP 05 74 3287, which is a foreign counterpart to the present application.

Notification of Reasons for Refusal, with English translation, issued Jul. 13, 2010 in connection with corresponding Japanese Patent Application No. 2006-513768.

* cited by examiner

TOUCH PANEL AND PROTECTIVE PANEL FOR DISPLAY WINDOW OF ELECTRONIC DEVICE USING THE SAME

TECHNICAL FIELD

The present invention relates to a touch panel to be used as a coordinate input means and a touch position detecting means and a protective panel for a display window of an electronic device using the same.

BACKGROUND ART

A touch panel includes two substrates opposed to each other and resistive films provided on opposed inner surfaces of the substrates. Further, on both ends of each of the resistive films, electrodes are provided. Such a touch panel operates on principles that power is externally supplied to both the resistive films alternately and an electrical signal corresponding to a position where the two resistive films are brought into contact with each other by a touch event is outputted to the outside via the electrodes to which no power is supplied. Usually, in view of the output of signals to the outside, each of the electrodes extends to a position corresponding to the position of a connecting part of the touch panel, and the ends of the individual electrodes are brought together in one place to facilitate connection between the electrodes and a lead wire of FPC (flexible printed circuit).

However, the touch side substrate is formed from a resin sheet and the electrodes are formed of a silver paste, so it is hard to say that the electrodes themselves have high strength. Further, conducting wires of the lead wire are connected to the electrodes, respectively, with a conductive paste having a low fixing power, and are held between the touch side substrate and the non-touch side substrate. Therefore, if a slightly large force is applied to the lead wire, there is a possibility that the conducting wire is broken at the connecting part. For this reason, the touch panel needs to be handled very carefully. Furthermore, when the touch panel is frequently touched by a sharp pen point, the touch panel may need to be replaced with a new one due to the damage on the surface of the touch side substrate. In this case, the maintenance by users becomes complicated.

In order to solve these problems, Japanese Patent Laid-open No. H9-50731 discloses a touch panel in which FPC is not directly drawn out from the side face thereof. Hereinbelow, the touch panel in the above identified publication is to be explained.

FIG. 10 is a partial longitudinal sectional view of a main part of the touch panel in which FPC is not directly drawn out from the side face thereof, and FIG. 11 illustrates the structure of electrodes. As shown in FIGS. 10 and 11, a touch side substrate 2, designed to be directly touched by an operator's finger, is formed from a transparent insulating member having a certain degree of flexibility such as, for example, a polyethylene terephthalate (PET) film. On the lower surface of the touch side substrate 2, there is provided a rectangular resistive film 2a of ITO (indium tin oxide) or the like formed by, for example, sputtering or vacuum deposition.

On the other hand, a non-touch side substrate 3 is provided so as to be opposed to the touch side substrate 2. Such a non-touch side substrate 3 is formed from a glass plate, a resin plate, or the like. On the upper surface of the non-touch side substrate 2, there is provided a rectangular resistive film 3a that is similar to the resistive film 2a provided on the touch side substrate 2. Further, at the periphery of the non-touch side substrate 3, there are provided through-holes 4a, 4b, 4c, and 4d to constitute a connecting part 5.

At opposite sides of the resistive film 2a in the Y direction, there are provided band-like electrodes 2b and 2c. At opposite sides of the resistive film 3a in the X direction, there are provided band-like electrodes 3b and 3c. These band-like electrodes 2b, 2c, 3b and 3c are formed using a silver paste. Each of the electrodes 2b, 2c, 3b, and 3c extends to a position corresponding to the position of the connecting part 5 provided at the end of the touch panel 1.

Into the through-holes 4a, 4b, 4c, and 4d, a conductive paste 8 such as a silver paste is injected, and then recessed (female) fittings 7 (see FIG. 12) or convex (male) fittings 13 (see FIG. 13) are embedded in the through-holes to electrically connect to the electrodes 2b, 2c, 3b, and 3c, thereby the connecting part 5 can be obtained for connecting with an external devices.

In the above-described configuration, electrical signals from the resistive films 2a and 3a can be easily taken out from the lower side of the touch panel 1 not by drawing out a lead wire from the side face of the touch panel 1 but by connecting other convex (male) fittings such as connector pins 12 to the recessed (female) fittings 7 or connecting other recessed (female) fittings to the convex (male) fittings 13, therefore it is possible to prevent the possibility of breaking of wires inside of the touch panel and to be extremely easier to be handling of the touch panel when mount to a device or maintenance.

However, such a touch panel disclosed in Japanese Patent Laid-open No. H9-50731 requires fitting accuracy between the recessed (female) fittings 7 embedded in the through-holes 4a, 4b, 4c, and 4d and other convex (male) fittings. More specifically, if the accuracy of position of the through-holes 4a, 4b, 4c, and 4d formed in the touch panel, the accuracy of inner diameter of the recessed (female) fittings 7, the accuracy of position of other convex (male) fittings, such as connector pins 12, provided in an interface so as to be fitted in the recessed (female) fittings 7, the accuracy of outer diameter of the other convex (male) fittings, or the accuracy of position of the touch panel mounted to a device is low, it will be difficult to fit the recessed (female) fittings 7 to other convex (male) fittings. As a result, it is impossible to mount the touch panel on a device properly and to connect the touch panel to the interface electrically. If the recessed (female) fittings 7 are forced to fit to other convex (male) fittings, stress is always applied to the touch panel, as a result, there is a possibility that the touch panel is deformed or cracked by an environmental resistance test (e.g., by temperature changes). In addition, there are also a possibilities that the touch panel is cracked due to repetition of attachment and detachment thereof and stable contact resistance is impaired.

On the other hand, even in a case where the recessed (female) fittings 7 are smoothly fitted to other convex (male) fittings, when contact between the recessed (female) fittings 7 and other convex (male) fittings is poor, stable contact resistance cannot be obtained.

There is a similar problem when convex (male) fittings 13 are embedded in the through-holes 4a, 4b, 4c, and 4d.

The object of the present invention is to provide a touch panel which is capable of solving the above problem, and is capable of obtaining a stable contact resistance without being required of fitting accuracy.

DISCLOSURE OF THE INVENTION

In order to achieve the above object, the present invention is directed to an analog type touch panel comprising:

a touch side substrate and a non-touch side substrate each having resistive films on the opposing inner surfaces thereof;

through-holes formed at the periphery of the non-touch side substrate; and a connecting part for electrically connecting electrodes of the resistive films to an external terminal by the through-holes; wherein a conductive paste is injected into the through-holes and a rivet is inserted into each of the through-holes from the lower surface side of the non-touch side substrate so that a head of the rivet forms flat electrodes for connecting with the external terminal on the lower surface of the non-touch side substrate.

In the present invention, a wall formed from an insulating layer is provided around an opening of the through-hole to be connected to the electrode provided on the upper surface of the non-touch side substrate, the wall provided at an arbitrary distance from the edge of the opening of the through-hole.

The present invention is also directed to an analog type touch panel comprising:

a touch side substrate and a non-touch side substrate each having resistive films on the opposing inner surfaces thereof;

through-holes formed at the periphery of the non-touch side substrate; and a connecting part for electrically connecting electrodes of the resistive films to an external terminal by the through-holes; wherein a rivet is inserted into each of the through-holes and is shaped to have heads at both ends of a shaft thereof so that one head of the rivet forms flat electrodes for connecting with the external terminal on the lower surface of the non-touch side substrate and the other head of the rivet is directly electrically connected to the electrode of the resistive film.

Further, the present invention is also directed to an analog type touch panel comprising:

a touch side substrate and a non-touch side substrate each having resistive films on the opposing inner surfaces thereof;

through-holes formed at the periphery of the non-touch side substrate; and a connecting part for electrically connecting electrodes of the resistive films to an external terminal by the through-holes; wherein a conductive paste is injected into the through-holes and the opening of each of the through-holes provided on the lower surface and a periphery of the opening of the through-hole are covered with a metal foil so that forms a flat electrodes for connecting with the external terminal on the lower surface of the non-touch side substrate.

Another content of the present invention is directed to a protective panel for a display window of an electronic device, comprising the touch panel of the present invention, wherein the non-touch side substrate is formed from a laminate obtained by bonding a resin sheet to an upper surface of a resin plate with a tackiness agent and the touch side substrate is formed to have at least a resin sheet on which a resistive film is to be formed and a decorative layer with a transparent window provided on the resin sheet.

In the present invention, the touch panel and the protective panel for a display window of an electronic device using the touch panel having such a structure described above produce the following effects.

Unlike the conventional touch panel requiring fitting accuracy of recessed (female) fittings or convex (male) fittings, the touch panel of the present invention does not require fitting accuracy because signals from the resistive films can be outputted to the outside through contact only at a planar area provided on the lower surface of the non-touch side substrate and provides a margin absorbing an error. As a result, mounting of the touch panel and electrical connection of the touch panel to an interface can be carried out more easily and very convenient compared to the conventional touch panel. Also, detachment of the touch panel and electrical disconnection of the touch panel from the interface can be easily carried out.

Further, unlike the conventional touch panel to be electrically connected to an interface by fitting using recessed (female) fittings or convex (male) fittings, the touch panel of the present invention is connected to an interface by contact at a planar area provided on the lower surface of the non-touch side substrate. Therefore, the touch panel of the present invention can be connected to an interface by pressing spring connector pins or the like provided in the interface against the flat electrodes for connection, which makes it possible to obtain stable contact resistance.

DETAILED DESCRIPTION OF THE INVENTION

Hereinbelow, some embodiments of a touch panel according to the present invention and a protective panel for a display window of an electronic device using the touch panel will be described in detail with reference to the accompanying drawings.

First Embodiment

Figure 1:
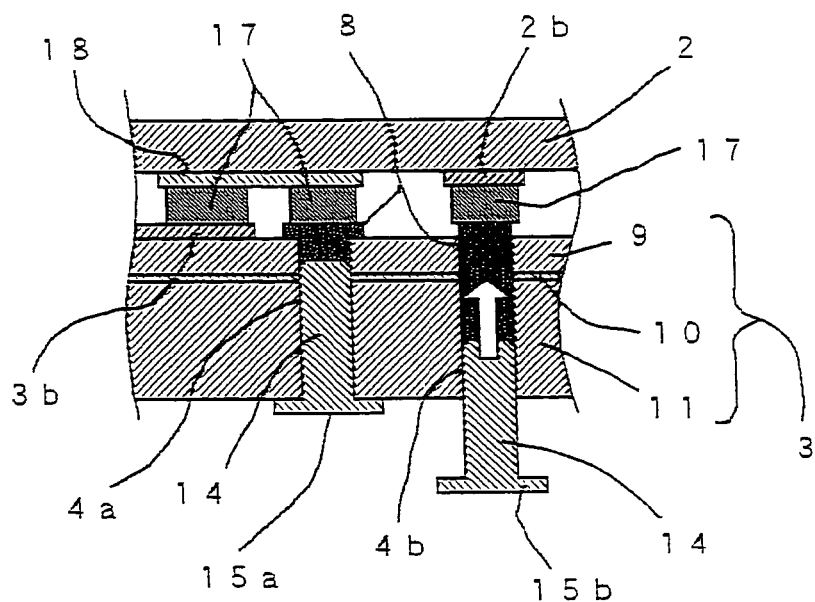
FIG. 1 is a longitudinal sectional view which illustrates a main part of a touch panel according to a first embodiment of the present invention.

FIG. 1 illustrates a first embodiment of a touch panel according to the present invention.

It is noted that a method for assembling the touch panel of the present invention is the same as a conventional method shown in FIG. 11, and therefore a touch panel 1 will be first described with reference to FIG. 11.

Figure 11:
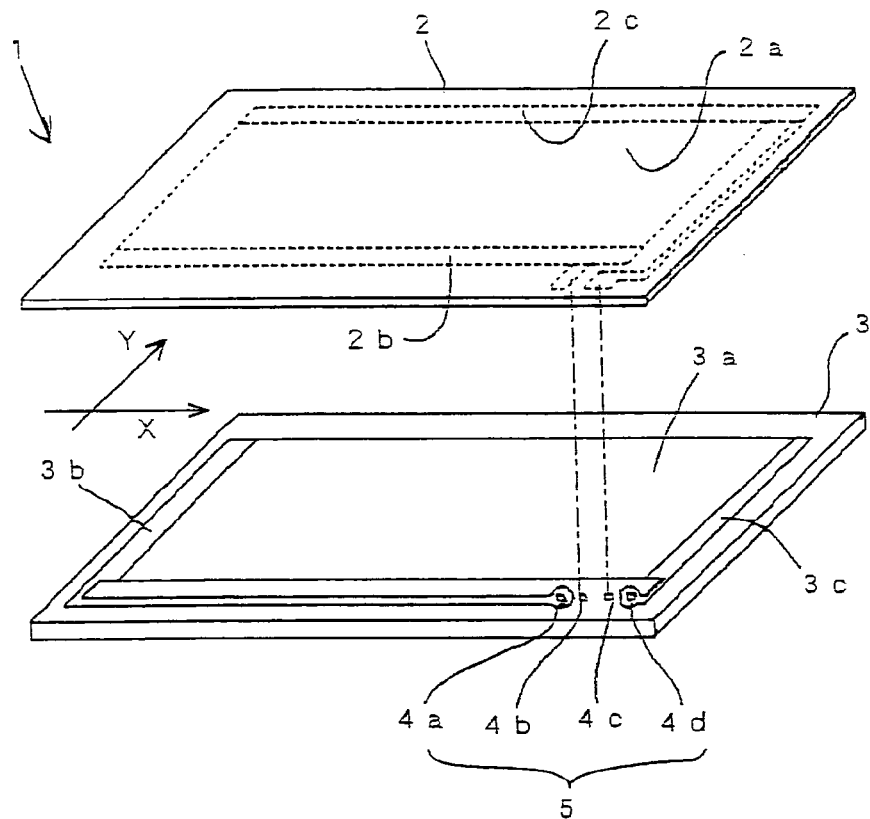
FIG. 11 is a perspective view which illustrates a method for assembling the touch panel equipped with through-holes according to the prior art.

As illustrated in FIG. 11, a resistive film 2a is formed by applying ITO or the like onto the lower surface of a touch side substrate 2 by way of sputtering or vacuum deposition. Also, on the upper surface of a non-touch side substrate 3, a rectangular resistive film 3a is formed in the same manner.

At the periphery of the non-touch side substrate 3, through-holes 4a, 4b, 4c, and 4d for constituting a connecting part 5 are formed to provide a touch panel in which an FPC (not shown in the drawing) is not directly drawn out from the side face thereof.

The touch panel 1 of the present invention having such a structure described above is characterized in that on the lower surface of the non-touch side substrate 3, there are provided flat electrodes for connection to an external terminal for the through-holes 4a, 4b, 4c, and 4d respectively.

More specifically, as shown in FIG. 1, a conductive paste 8 is injected into the through-holes 4a and 4b, a rivet 14 is inserted into each of the through-holes 4a and 4b from the lower surface side of the non-touch side substrate 3, and the heads of the rivets 14 form flat connecting electrodes 15a and 15b. It is noted that the through-holes 4c and 4d are the same as the through-holes 4a and 4b, therefore they are omitted from FIG. 1.

It is preferable that the touch side substrate 2 is formed by a resin sheet excellent in transparency, scratch resistance, chemical resistance, and heat resistance. Examples of a material for such a resin sheet include engineering plastics such as polycarbonate type, polyamide type, and polyether keton type; resin materials such as acrylic type; polyethylene terephthalate-type; and polybutylene terephthalate-type. In addition, on the surface of the touch side substrate 2 opposite to the surface where the resistive film 2a is provided, a hard coated layer may be formed.

Examples of a material for forming a hard coated layer include inorganic materials such as siloxane type; and organic materials such as thermosetting resins (e.g., acrylic epoxy type resins, urethane type resins) and photocurable resins (e.g., acrylate type resins).

The thickness of the hard coated layer is preferably in the range of about $1 \times 10^{-3}$ to $7 \times 10^{-3}$ mm. Also on the surface of the touch side substrate 2 opposite to the surface where the resistive film 2a is provided may be subject to nonglare treatment for preventing light reflection. For example, the touch side substrate 2 or the hard coated layer may be treated to have surface irregularities, or fine particles of an extender pigment, silica, or alumina may be added to the hard coated layer. The touch side substrate 2 is not limited to a single resin sheet, laminated body consist of two or more resin sheets may be applicable.

The non-touch side substrate 3 may be formed by an engineering plastics such as polycarbonate type, polyamide type, and polyether keton type; resin plate or a resin sheet such as acrylic resin type; polyethylene terephthalate type; and polybutylene terephthalate type.

The non-touch side substrate 3 may be formed from a laminated product obtained by bonding a resin plate 11 and a resin sheet 9 with a tackiness agent 10. Such a laminate structure of the non-touch side substrate is preferred from the viewpoint of improving the durability of the touch panel as a whole. The thickness of the non-touch side substrate 3 can be selected from a range of 0.2 to 3.0 mm, however, 1.0 mm is particularly preferable.

The resistive films 2a and 3a can be formed by using metal oxide films, such as tin oxide, indium oxide, antimony oxide, zinc oxide and cadmium oxide, composite films mainly composed of these metal oxides or metal films such as gold, silver, copper, tin, nickel, aluminum and palladium beside ITO as described abode. Alternatively, each of the resistive films 2a and 3a may be formed with two or more layers.

The resistive films 2a and 3a can be formed using the methods mentioned above, but may alternatively be formed using other methods such as ion plating and CVD. The resistive films 2a and 3a can be formed into a rectangular shape by removing an unnecessary portion by etching with, for example, acid or by covering an unnecessary portion with an insulating film. Further, an insulating spacer may be formed on the surface of either the resistive film 2a or the resistive film 3a.

The structure of the electrodes is substantially the same as that described in Japanese Patent Laid-open No. H9-50731. More specifically, as shown in FIG. 11, at the opposite sides of the resistive film 2a in the Y direction, there are provided band-like electrodes 2b and 2c, and at the opposite sides of the resistive film 3a in the X direction, there are provided band-like electrodes 3b and 3c. These band-like electrodes 2b, 2c, 3b, and 3c are formed by using a silver paste. Each of the electrodes 2b, 2c, 3b, and 3c extends to a position corresponding to the position of the connecting part 5 provided at the end of the touch panel 1. As described above, the electrodes 2b, 2c, 3b, and 3c can be formed using a silver paste, but may be formed using other conductive pasts such as a metal paste e.g., gold, copper, nickel or a carbon paste. The electrodes 2b, 2c, 3b, and 3c can be formed by a printing method such as screen printing, offset printing, gravure printing, or flexographic printing, a photoresist method, or a brush coating method. It is noted that the area corresponding to the through-holes 4a, 4b, 4c, and 4d, that is, the area of the connecting part 5 is made large to prevent the effect of some misregistration during printing on conductivity.

The through-holes 4a, 4b, 4c, and 4d are formed in the non-touch side substrate 3 by, for example, drilling or press work. The diameter of each of the through-holes 4a, 4b, 4c, and 4d is preferably in the range of 0.1 to 1.0 mm. If the diameter of the through-hole is less than 0.1 mm, there is a possibility that electrical continuity in the through-hole is not ensured. On the other hand, if the diameter of the through-hole exceeds 1.0 mm, the conductive paste 8 may not be properly injected into the through-hole or the amount of the conductive paste 8 to be used may become unnecessarily large, thereby increasing manufacturing costs.

It is preferable that fine irregularities of the inner surfaces of the through-holes 4a, 4b, 4c, and 4d are minimized and that each of the through-holes is circular in cross-section. This makes it possible to sufficiently ensure uniform electrical continuity in each of the through-holes 4a, 4b, 4c, and 4d. In addition, if a shape of the through-hole is made circular in cross-section, through-holes can be easily formed using a drill or the like, and as a result, the drilling process will be easier.

Figure 18:
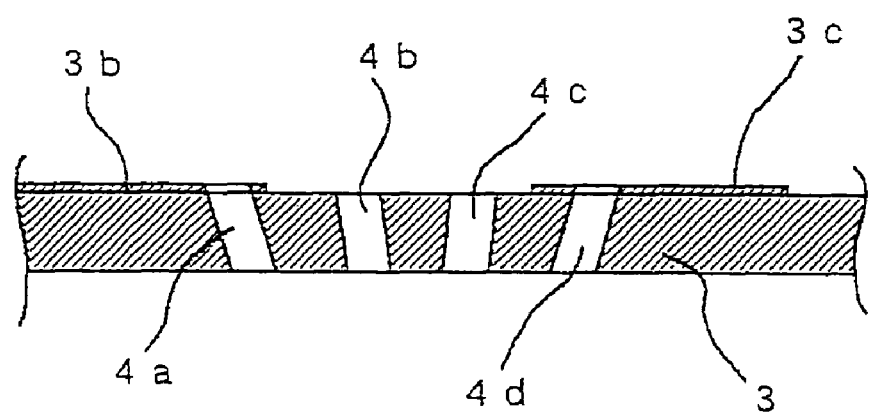
FIG. 18 is a longitudinal sectional view which illustrates a main part of the touch panel according to the present invention in which through-holes are inclined.

The longitudinal cross-section of each of the through-holes 4a, 4b, 4c, and 4d may be parallel or inclined to the thickness direction. In a case where the longitudinal cross-section of each of the through-holes 4a, 4b, 4c, and 4d is inclined to the thickness direction (see FIG. 18), the positions of the flat electrodes for connection are shifted so as to come close to each other, thereby reducing the space of the connecting part 5.

There is provided an insulating spacer between the touch side substrate 2 and the non-touch side substrate 3. More specifically, the touch side substrate 2 and the non-touch side substrate 3 are laminated together via the insulating spacer in such a manner that the resistive film 2a and the resistive film 3a are opposed to each other. The peripheral portions of the touch side substrate 2 and the non-touch side substrate 3 are brought into close contact with each other by holding them with a holding device (not shown in the drawings) such as an aluminum chassis or by using a two-sided tape or an adhesive.

The insulating spacer can be made up of fine dots of a transparent photocurable resin formed by using a photo process. Examples of such a transparent photocurable resin include acrylate resins such as melamine acrylate resins, urethane acrylate resins, epoxy acrylate resins, methacryl acrylate resins, and acryl acrylate resins, and polyvinyl alcohol resins. Alternatively, the insulating spacer may be composed of a plurality of fine dots formed by using a printing method.

After the conductive paste 8 such as a silver paste is poured as an adhesive into the through-holes 4a, 4b, 4c, and 4d, the rivet 14 is inserted into each of the through-holes from the lower surface side of the non-touch side substrate 3, and then the conductive paste 8 is thermally cured. By doing so, each of the electrodes 2b, 2c, 3b, and 3c is electrically connected to the rivets 14, and the heads of the rivets 14 inserted into the through-holes form flat connecting electrodes.

Figure 10:
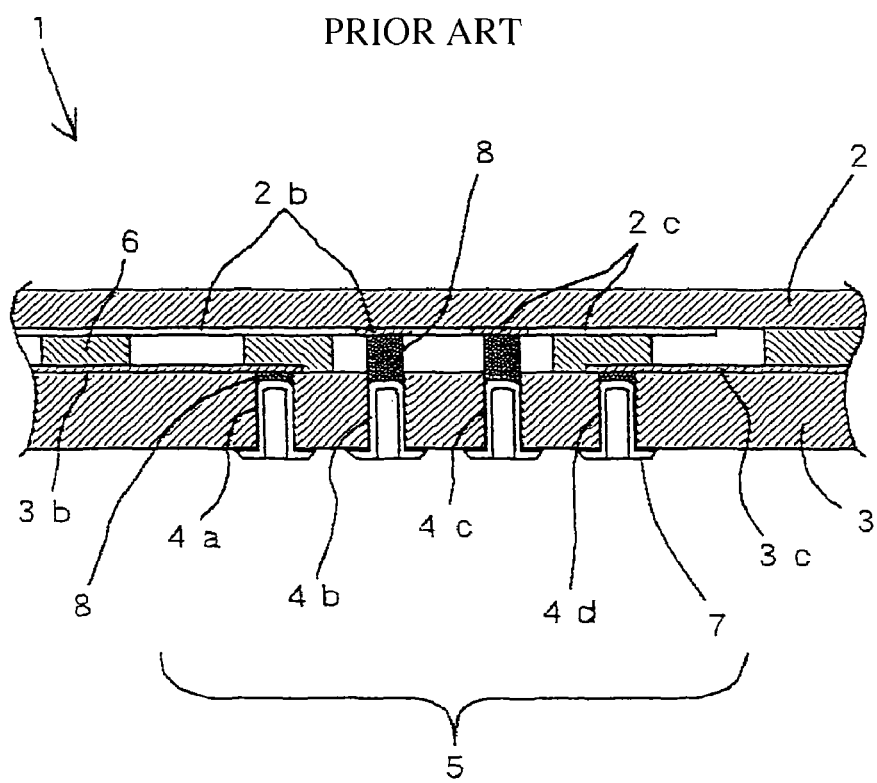
FIG. 10 is a fragmentary cross-sectional view which illustrates a touch panel according to the prior art.
Figure 13:
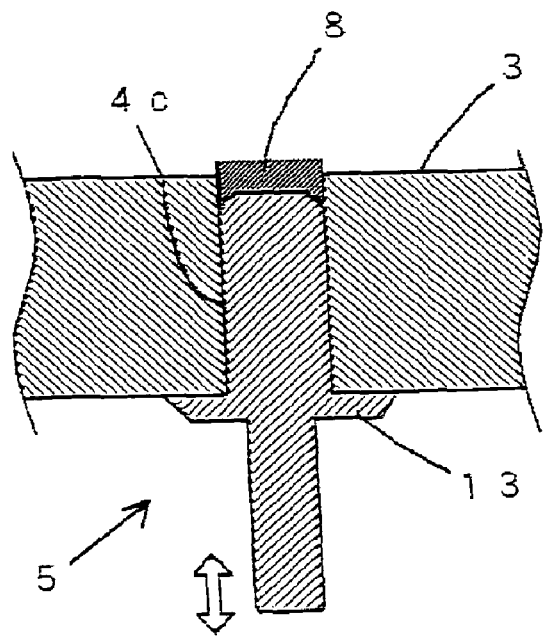
FIG. 13 is an enlarged view which illustrates another method for connecting a pin to the touch panel according to the prior art.

Therefore, unlike a conventional connection using the recessed (female) fittings 7 (see FIG. 10) or convex (male) fittings 13 (see FIG. 13), the signals from the resistive films 2a and 3a are capable of outputting to the outside through contact only at a planar area provided on the lower surface of the non-touch side substrate 3.

Figure 2:
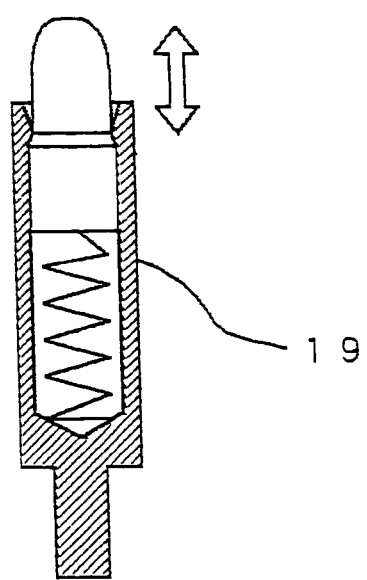
FIG. 2 is a longitudinal sectional view which illustrates a spring connector pin for connecting the touch panel according to the present invention.

In a case where the touch panel 1 is to be attached to the front surface of an interface board or a liquid crystal display panel of a given device, spring connector pins 19 (see FIG. 2) connected to an interface are provided in the device at positions corresponding to the positions of the flat connecting electrodes so that the spring connector pins can come into contact with the heads of the rivets 14 that form flat connecting electrodes when the touch panel 1 is mounted to the device. By providing such spring connector pins, high fitting accuracy is not required and therefore mounting of the touch panel 1 and electrical connection of the touch panel 1 to the interface can be more easily carried out and extremely convenience as compared to the conventional touch panel. In addition, there is no possibility that the connecting part is damaged due to connecting. Also, detachment of the touch panel 1 from the device and electrical disconnection of the touch panel 1 from the interface can be easily carried out.

The material of the conductive paste 8 to be filled in the through-holes 4a, 4b, 4c, and 4d may be a copper paste instead of the silver paste described above. The conductive paste 8 can be filled in the through-holes by, for example, a dispenser or screen printing. In addition to the filling of the conductive paste 8 in the through-holes, a nickel film or the like formed by electroless plating or electrolytic plating may be provided on the inner surfaces of the through-holes 4a, 4b, 4c, and 4d.

In this embodiment, the rivet 14 is used without riveting, that is, the rivet 14 is used as it is (i.e., as a fresh rivet) with only one end thereof having a head. The head of the rivet has a disk-like shape and a flat surface. The thickness of the head of the rivet is in the range of 20 to 200 μm.

In a case where the longitudinal cross-section of each of the through-holes 4a, 4b, 4c, and 4d is inclined to the thickness direction, the head seating surface of the rivet 14 is also inclined.

Examples of a material of the rivet 14 include copper, iron, nickel, aluminum, and stainless steel. Both ends of the shaft of the rivet 14 are preferably plated with gold, thereby improving conductivity and reducing contact resistance. Further, gold plating of both ends of the rivet 14 makes it possible to prevent contact resistance from being increased due to oxidation of the rivet 14 and to increase the surface hardness of the rivet 14 itself so that the reliability of the connecting part 5 is improved.

It is noted that in this embodiment, a communicating electrode 18 shown in FIG. 1 is preferably provided. If the communicating electrode 18 is provided, a conducting route is as follows: electrode 3b or 3c provided on upper surface of non-touch side substrate 3→conductive adhesive 17→communicating electrode 18→conductive adhesive 17→conductive paste 8→flat connecting electrode 15a or 15d. Another conducting route is as follows: electrode 2b or 2c provided on lower surface of touch side substrate 2→conductive adhesive 17→conductive paste 8→flat connecting electrode 15b or 15c.

When such a communicating electrode 18 is provided, the electrode 3b or 3c provided on the upper surface of the non-touch side substrate 3 and the communicating electrode 18 are opposed to each other, and the communicating electrode 18 and the through-hole 4a or 4d are also opposed to each other. Therefore, an electrical contact area between the electrode 3b or 3c provided on the upper surface of the non-touch side substrate 3 and the through-hole 4a or 4d can be made sufficiently larger as compared to a case where the electrode 3b or 3c is directly electrically connected to the through-hole 4a or 4d. As the conductive adhesive 17, an ink obtained by dispersing conductive particles such as silver or nickel in an epoxy type resin or a silicon type resin can be used. The conductive adhesive 17 can be applied, for example, by a dispenser and the like.

In a case where the electrode 3b or 3c provided on the upper surface of the non-touch side substrate 3 is directly electrically connected to the through-hole 4a or 4d without through the communicating electrode 18, an electrical contact area between them cannot be made sufficiently large, but can be made large to some extent by covering the upper surface of the electrode 3b or 3c provided on the upper surface of the non-touch side substrate 3 with the conductive paste 8 injected into the through-hole 4a or 4d.

Figure 15:
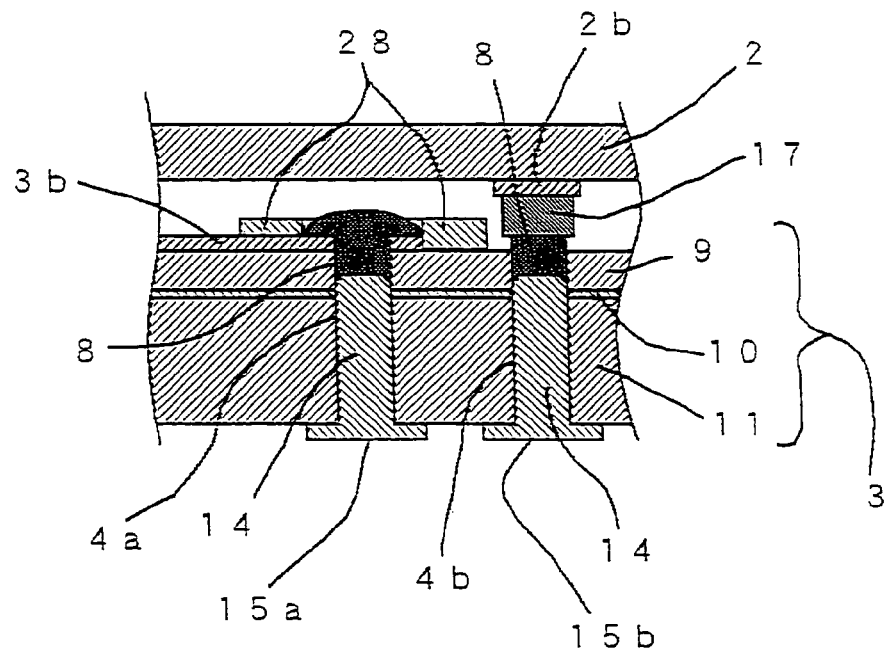
FIG. 15 is a longitudinal sectional view of a main part of the touch panel according to the present invention, which illustrates the structure for trapping a conductive paste.
Figure 16:
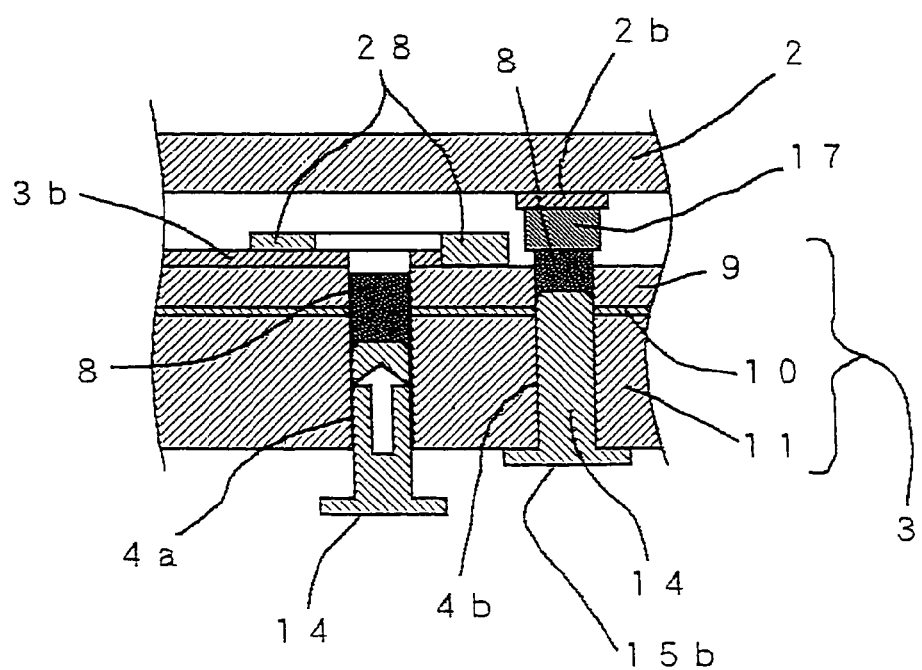
FIG. 16 is a longitudinal sectional view of a main part of the touch panel according to the present invention which illustrates the step of inserting a rivet shown in FIG. 15.
Figure 17:
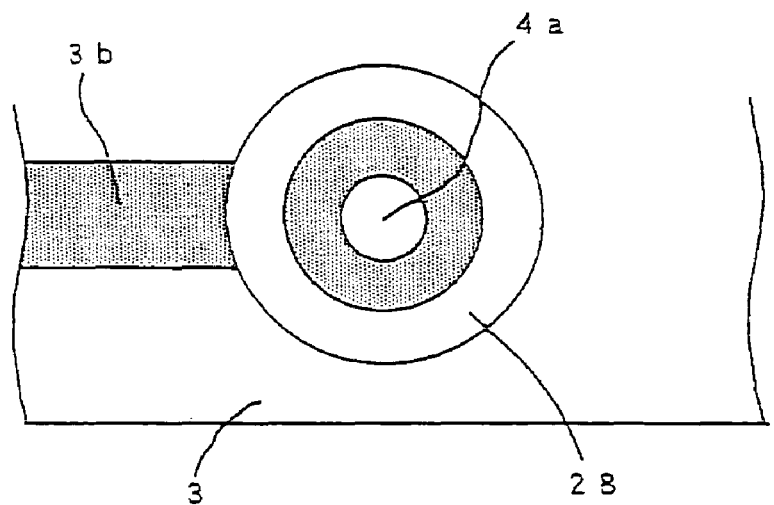
FIG. 17 is a plan view which illustrates an insulating layer illustrated in FIG. 15.

However, in this case, there is a possibility that the coating area cannot be controlled when the conductive paste 8 is pushed out from the through-hole 4a or 4d by the insertion of the rivet 14, and thus a short-circuit occurs in the connecting part 5. Therefore, in a case where the electrode 3b or 3c is to be directly electrically connected to the through-hole 4a or 4d without the communicating electrode 18, it is preferable that a ring-shaped wall formed from an insulating layer 28 is provided around the opening of the through-hole 4a or 4d to be connected to the electrode 3b or 3c provided on the upper surface of the non-touch side substrate 3 at a given distance from the edge of the opening of the through-hole (see FIGS. 16 and 17). By providing such a ring-shaped wall, it is possible to trap the conductive paste 8 in an area surrounded by the insulating layer 28 (see FIG. 15).

The material of the insulating layer 28 may be an ink obtained using a polyester resin or an epoxy resin as a binder. In a case where such an ink is used for forming the insulating layer 28, screen printing is preferably employed. The height of the wall of the insulating layer 28 is preferably in the range of 10 to 30 µm. If the height of the wall of the insulating layer 28 is less than 10 µm, there is a possibility that the conductive paste 8 cannot be trapped in an area surrounded by the insulating layer 28. On the other hand, if the height of the wall of the insulating layer 28 exceeds 30 µm, it is difficult to form it by printing.

Second Embodiment

Figure 3:
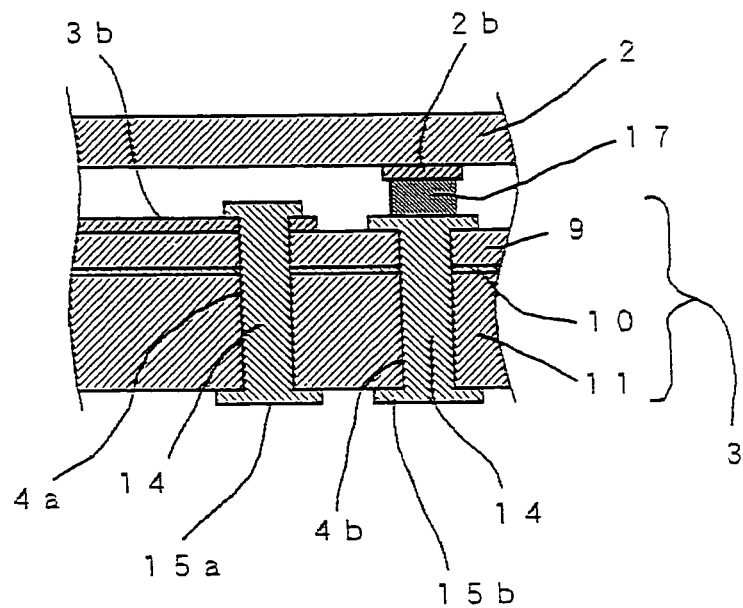
FIG. 3 is a longitudinal sectional view which illustrates a main part of the touch panel according to a second embodiment of the present invention.

FIG. 3 illustrates a second embodiment of the touch panel according to the present invention.

The touch panel shown in FIG. 3 is characterized in that the rivet 14 provided in each of the through-holes 4a and 4b has heads at both ends of a shaft thereof. More specifically, after the rivet 14 having a head is inserted into each of the through-holes 4a and 4b for constituting the connecting part 5, the tip of a shaft of the rivet 14 also be formed into a head. One of the heads of the rivet 14 provided on the lower surface of the non-touch side substrate 3 forms the flat connecting electrode 15a or 15b for connection to an external terminal, and the other head of the rivet 14 is directly electrically connected to the electrode 2b or 3b of the resistive film 2a or 3a without through the communicating electrode 18. It is noted that the through-holes 4c and 4d are the same as the through-holes 4a and 4b, and are therefore omitted from FIG. 3.

Figure 4:
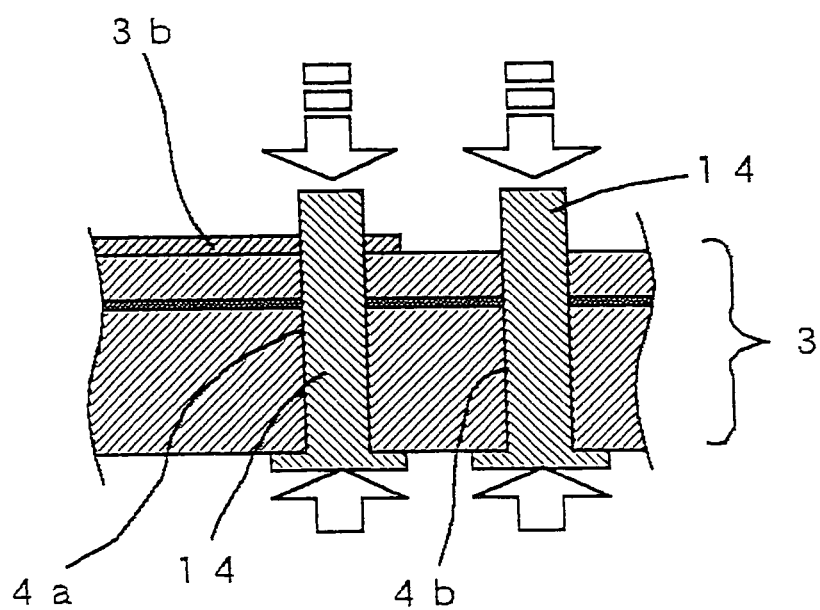
FIG. 4 is an illustration for explaining a method for forming the rivet illustrated in FIG. 3.

The rivet 14 having heads at both ends of a shaft thereof can be obtained by inserting a fresh rivet into the through-hole, holding the head of the fresh rivet with, for example, a rivet holder, and hammering the other end of the shaft with a compressed-air operated rivet hammer (see FIG. 4).

Other components are substantially the same as those of the first embodiment, and therefore the description thereof will be omitted.

The touch panel 1 of the second embodiment having such a structure described above has the following effects in addition to the effects described with reference to the first embodiment. More specifically, the rivet 14 inserted into each of the through-holes 4a, 4b, 4c, and 4d has heads at both ends of the shaft thereof, and therefore unlike the first embodiment, the rivet 14 can be fixed to the non-touch side substrate 3 without injecting the conductive paste 8 into the through-holes 4a, 4b, 4c, and 4d. Further, the electrode 3b or 3c of the resistive film provided on the upper surface of the non-touch side substrate 3 is in surface contact with the under surface of the head of the rivet 14, and therefore electrical connection is ensured without through the communicating electrode 18.

Figure 5:
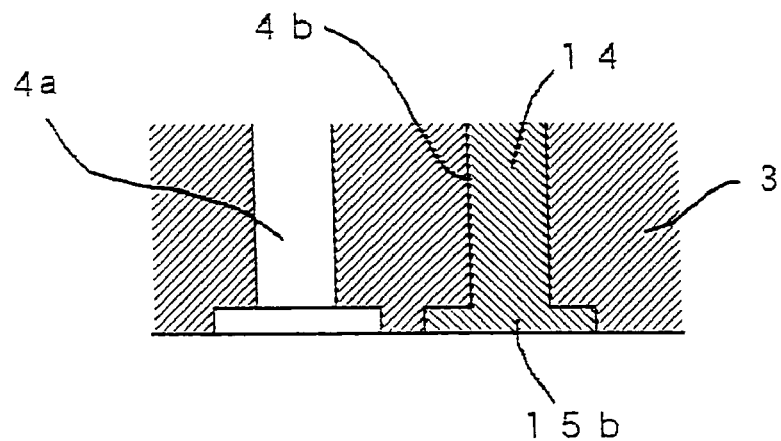
FIG. 5 is an enlarged cross-sectional view which illustrates a variation of flat electrodes for connection shown in FIG. 1 or FIG. 3.

In the first and second embodiments, the head of the rivet 14, which forms the flat electrode 15a or 15b for connection to an external terminal, may be embedded in the non-touch side substrate 3 as shown in FIG. 5. By using this configuration the under surface of the non-touch side substrate 3 can be made flat, and therefore part of the non-touch side substrate 3 where the rivets 14 are not provided is not bent downwardly even when the non-touch side substrate 3 is placed on a jig and pressure is applied thereto from the front surface side thereof.

As a result, it will be easier for the attachment of the touch side substrate 2 to the non-touch side substrate 3 and checking of the touch panel.

Third Embodiment

Figure 6:
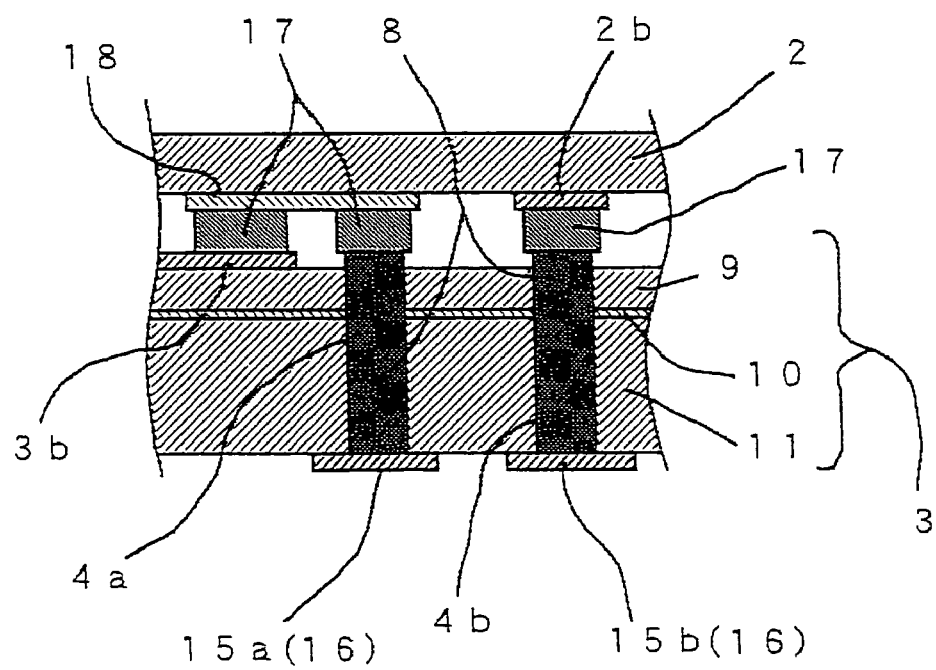
FIG. 6 is a longitudinal sectional view which illustrates a main part of the touch panel according to a third embodiment of the present invention.

FIG. 6 illustrates a third embodiment of the touch panel according to the present invention.

The touch panel of the third embodiment shown in FIG. 6 is characterized in that a metal foil 16 is used instead of the rivet 14 to form a head. More specifically, the conductive paste 8 is injected into the through-holes 4a and 4b constituting the connecting part 5, and an opening of each of the through-holes 4a and 4b provided in the lower surface of the non-touch side substrate 3 and a periphery of the opening of the through hole are covered with a disk-like shaped metal foil 16. The metal foil 16 provided on the lower surface of the non-touch side substrate 3 forms the flat electrode 15a or 15b for connection to an external terminal. It is noted that the through-holes 4c and 4d are the same as the through-holes 4a and 4b, and are therefore omitted from FIG. 6.

Examples of a material for forming the metal foil 16 include copper, iron, nickel, and aluminum. The thickness of the metal foil 16 is in the range of 20 to 200 µm. The opening of the through-hole provided in the lower surface of the non-touch side substrate 3 and a periphery of the opening of the through-hole can be covered with the metal foil 16, for example, by attaching the metal foil thereto with a tackiness agent. Alternatively, the opening of the through-hole 4a or 4b and a periphery of the opening provided in the lower surface of the non-touch side substrate 3 may be given counter boring to form a recess. The opening and the periphery of the opening can be covered by simply fitting the metal foil 16 in the recess. In this case, it is possible to completely embed the metal foil 16 in the non-touch side substrate 3, thereby producing the same effects as in the above-described case where the head of the rivet 14 is embedded in the non-touch side substrate 3.

Other components are substantially the same as those described with reference to the first embodiment, and therefore the description thereof will be omitted.

Figure 12:
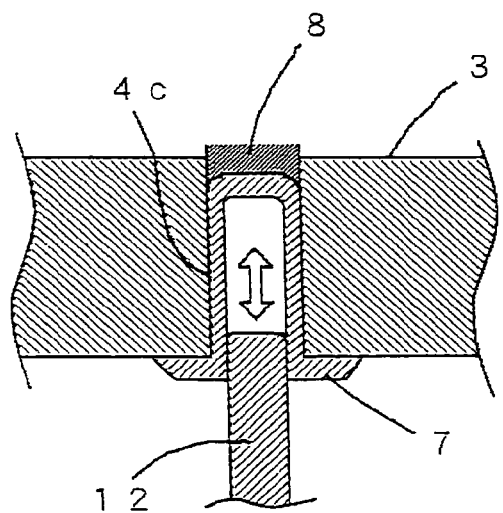
FIG. 12 is an enlarged view which illustrates a method for connecting a pin to the touch panel shown in FIG. 10.

Unlike the conventional touch panel using the recessed (female) fittings 7 (see FIG. 12) or convex (male) fittings 13 (see FIG. 13), the touch panel 1 having such a structure described above is capable of outputting signals from the resistive films 2a and 3a to the outside through contact only at a planar area provided on the lower surface of the non-touch side substrate 3 without requiring fitting accuracy. Therefore, mounting of the touch panel and electrical connection of the touch panel to an interface can be more easily carried out as compared to the conventional touch panel, which is very advantageous. Also, detachment of the touch panel 1 and electrical disconnection of the touch panel 1 from the interface can be easily carried out. Further, there is no possibility that the connecting part is damaged due to fitting.

Figure 14:
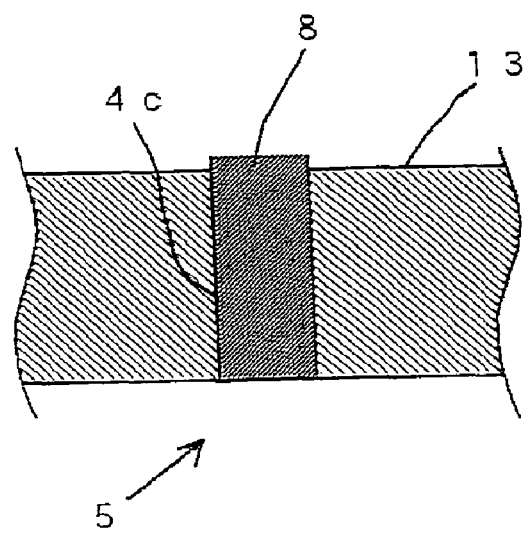
FIG. 14 is a longitudinal sectional view which illustrates a main part of the touch panel according to the prior art.

Meanwhile, Japanese Patent Laid-open No. H9-50731 discloses a method for forming a contact point by injecting only a conductive paste 8 into a through-hole in such a manner that the conductive paste 8 protrudes through the opening of the through-hole as a head (see FIG. 14). In this case, the contact point does not satisfy durability and resistance value. This is because the solid content of the conductive paste 8 prepared by dispersing a metal filler (e.g., silver, copper, nickel and the like) in a binder resin cannot be raised to 100% when the printability of the conductive paste 8 as an ink is taken into consideration. In general, the solid content of such an ink is about 60%, and therefore a contact point formed using such an ink is inferior in durability and has higher resistance as compared to that formed using a pure metal. Such a contact point is not satisfactory for use as a contact point with an external terminal.

On the other hand, in the touch panel 1 of the third embodiment, openings of the through-holes 4a, 4b, 4c, and 4d provided in the lower surface and periphery of the openings of the through-hole are covered with the metal foil 16, and the metal foil 16 forms the flat electrodes 15a, 15b, 15c, and 15d for connection to an external terminal on the lower surface of the non-touch side substrate 3. Therefore, the contact points of the touch panel 1 of the third embodiment have no problem in durability and resistance value.

The present invention has been described with reference to some embodiments, but the structure of the touch panel of the present invention is not limited to the embodiments described above. For example, in the first to third embodiments, the through-holes 4a, 4b, 4c, and 4d are brought together in one place to constitute the connecting part 5, but may be formed at different places to separately provide connecting parts for the electrodes. This makes it possible to use space efficiently.

Further, the touch panel 1 of each of the embodiments described above may have an additional function in addition to a coordinate input function and a touch position detection function.

For example, the touch panel 1 can also serve as a protective panel for a display window of an electronic device.

Figure 7:
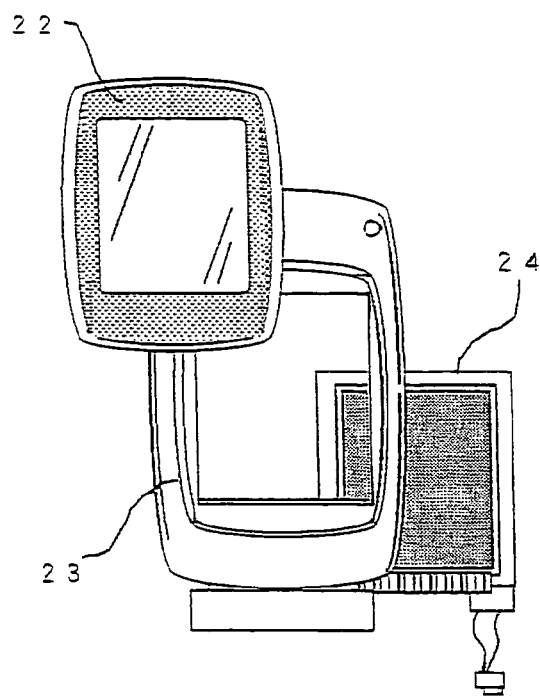
FIG. 7 is an exploded view which illustrates an implementation example of a protective panel for a display window of an electronic device according to the present invention.

Generally, electronic devices such as mobile phones and smart phones have flat casings composed of front and rear cases made of a synthetic resin. Further, on the surface of the front case 23, a protective panel 22 is fixed by, for example, fusion or the like to protect a display 24. The protective panel 22 is conventionally formed from a transparent and colorless resin plate, but has recently been provided with decoration (edging or the like) by printing as the demand for stylish electronic devices increases (see FIG. 7). Further, there is growing demand for a next-generation mobile phone having touch panel function.

Figure 8:
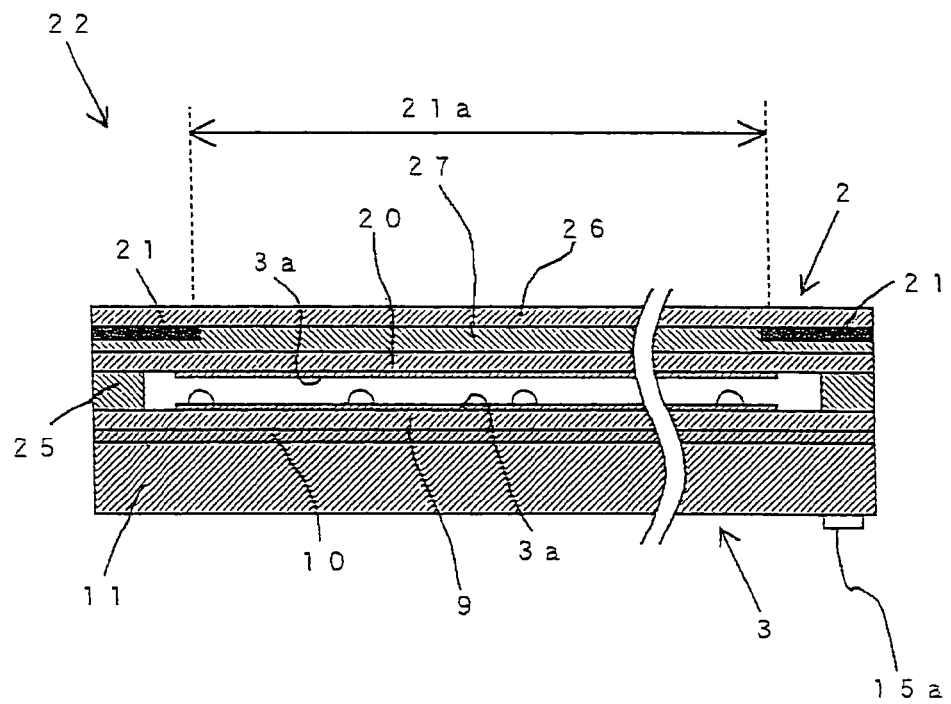
FIG. 8 is a cross-sectional view which illustrates the protective panel for a display window of an electronic device according to the present invention.

Specifically, the touch panel 1 also serves as a protective panel 22 for a display window of an electronic device, the non-touch side substrate 3 is formed from a laminate obtained by bonding the resin sheet 9 to the upper surface of the resin plate 11 having protective function with the tackiness agent 10, and the touch side substrate 2 is formed so as to have at least a resin sheet 20 on which the resistive film 2a is to be formed and a decorative layer 21 with a transparent window 21a provided on the resin sheet 20 (see FIG. 8). It is noted that the through-hole 4a is not shown in FIG. 8 because the cross-sectional view shown in FIG. 8 is not taken along a line passing through the flat connecting electrode 15a.

The decorative layer 21 of the protective panel is usually formed by printing.

As a material for forming the printing layer, a colored ink is preferably used. Such a colored ink contains a colorant such as a pigment or dye of any desired color and a binder such as a polyvinyl chloride-type resin, a polyamide-type resin, a polyester-type resin, a polyacrylic-type resin, a polyurethane-type resin, a polyvinyl acetal-type resin, a polyester urethane-type resin, a cellulose ester-type resin, or an alkyd resin.

Examples of a method for forming the printing layer include conventional printing methods such as offset printing, gravure printing, and screen printing. Particularly, in a case where multiple color printing or gradation expression is carried out, offset printing or gravure printing is preferred. On the other hand, in the case of single color printing, a coating method such as gravure coating, roll coating, or comma coating may be employed. It is noted that the printing layer is provided entirely or partially according to desired decoration.

The decorative layer 21 may be formed from a metal thin film layer or a combination of a printing layer and a metal thin film layer. The metal thin film layer is provided to give metallic luster to the decorative layer 21, and is formed by, for example, vacuum deposition, sputtering, ion plating, or plating. In this case, according to a desired metallic luster color, metals such as aluminum, nickel, gold, platinum, chromium, iron, copper, tin, indium, silver, titanium, lead, and zinc, or alloys or compounds of two or more of these metals are used. Usually, such a metal thin film layer is partially formed. Further, in a case where the metal thin film layer is to be provided, a front anchor layer or a rear anchor layer may be formed for improving adhesion to other layers.

The decorative layer 21 can be directly formed on the upper surface of the resin sheet 20 having the resistive film 2a, but, as shown in FIG. 8, it may be formed on the lower surface of a covering sheet 26 and bonded to the upper surface of the resin sheet 20 with a tackiness agent 27.

Figure 9:
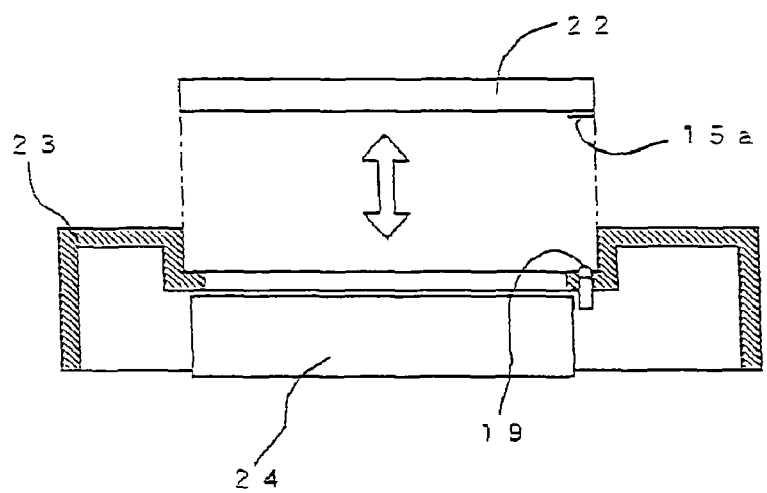
FIG. 9 is a cross-sectional view which illustrates an implementation example of the protective panel for a display window of an electronic device according to the present invention.

In a case where the protective panel 22 is to be mounted to the surface of the front case 23 to protect the display 24 of an electronic device, for example, as shown in FIG. 9, the spring connector pin 20 connected to an interface is provided at a position corresponding to the position of the flat connecting electrode 15a on the surface of the front case 23 to which the protective panel 22 is to be fusion bonded. Accordingly, the spring connector pin 20 can come into contact with the flat connecting electrode 15a when the protective panel 22 is to be mounted.

The protective panel 22 is fitted in the recess of the front case 23 so as to be substantially flush with the surface of the front case 23, and the side surfaces of the protective panel 22 are in close contact with the inner wall of the recess of the front case 23. In another words, there is no flexibility in positioning of the protection panel 22. As described above, the structure of the touch panel of the present invention can be connected to an external terminal without requiring fitting accuracy. Therefore, it can be said that the touch panel of the present invention is very suitable for use as the protective panel 22 for an electronic device.

INDUSTRIAL APPLICABILITY

The present invention relates to an analog resistive touch panel to be arranged on a display connected to a computer, such as LCD (liquid crystal display) or CRT (cathode-ray tube), which is capable of inputting to the computer, a position touched by a finger or a pen following to directions indicated on the display seen through the touch panel. Particularly, such a touch panel is suitable for use in handheld terminals (PDA=personal digital assistant), mobile phones, and smart phones.

The invention claimed is:
1. An analog type touch panel comprising:
a touch side substrate having a resistive film on an inner surface thereof;
a non-touch side substrate having a resistive film on an inner surface thereof, the inner surface of the non-touch side substrate opposing the inner surface of the touch side substrate;
electrodes for connecting the resistive films to an external terminal, the electrodes including an electrode provided on the inner surface of the non-touch side substrate;
through-holes formed at a periphery of the non-touch side substrate;

a wall formed from an insulating layer provided around an opening of at least one of the through-holes and being connected to the electrode provided on the inner surface of the non-touch side substrate;

a conductive paste injected into the through-holes; and a rivet inserted into each of the through-holes from a lower surface side of the non-touch side substrate so that a head of each rivet forms a flat electrode for connecting with the external terminal on the lower surface of the non-touch side substrate, wherein the conductive paste and the rivets form a connecting part for electrically connecting the electrodes to the external terminal by the through-holes, and wherein the wall is provided at a distance from an edge of the opening so as to trap the spread of the conductive paste.

2. A protective panel for a display window of an electronic device, the protective panel comprising:

the touch panel according to claim 1, wherein the non-touch side substrate is formed from a laminate obtained by bonding a resin sheet to an upper surface of a resin plate with a tackiness agent, and wherein the touch side substrate includes a resin sheet on which the resistive film of the touch side substrate is formed and a decorative layer with a transparent window provided on the resin sheet.

3. The touch panel of claim 1, wherein the connecting part is formed by:

providing the wall on the inner surface of the non-touch side substrate so as to circumscribe the opening of the at least one through-hole, the electrode provided on the inner surface of the non-touch side substrate being within an area circumscribed by the wall;

injecting the conductive paste into the through-holes; and inserting one of the rivets into the at least one through-hole such that the conductive paste extrudes from the at least one through-hole onto the inner surface of the non-touch side substrate, wherein the spread of the conductive paste on the inner surface of the non-touch side substrate is trapped by the wall.

4. The touch panel of claim 1, wherein the conductive paste is disposed on the inner surface of the non-touch side substrate in an area confined by the wall.

5. The touch panel of claim 1, wherein the conductive paste is disposed on the inner surface of the non-touch side substrate exclusively in an area confined by the wall.

6. The touch panel of claim 1, wherein the connecting part is formed by:

injecting the conductive paste into the through-holes;

providing the wall on the inner surface of the non-touch side substrate so as to circumscribe the opening of the at least one through-hole; and inserting one of the rivets into the at least one through-hole such that the conductive paste extrudes from the at least one through-hole onto the inner surface of the non-touch side substrate, wherein the spread of the conductive paste on the inner surface of the non-touch side substrate is trapped by the wall, and wherein the conductive paste contacts the electrode provided on the inner surface of the non-touch side substrate such that an electrical connection is provided between the rivet and the electrode provided on the inner surface of the non-touch side substrate.

7. The touch panel of claim 1, wherein the conductive paste is disposed on the inner surface of the non-touch side substrate in an area confined by the wall, and wherein the conductive paste contacts the electrode provided on the inner surface of the non-touch side substrate such that an electrical connection is provided between one of the rivets and the electrode provided on the inner surface of the non-touch side substrate.

8. The touch panel of claim 1, wherein the conductive paste is disposed on the inner surface of the non-touch side substrate exclusively in an area confined by the wall, and wherein the conductive paste contacts the electrode provided on the inner surface of the non-touch side substrate such that an electrical connection is provided between one of the rivets and the electrode provided on the inner surface of the non-touch side substrate.

* * * * *